(12) United States Patent
Komatsubara (10) Patent No.: US 7,709,350 B2
(45) Date of Patent: May 4, 2010

(54) METHOD FOR MANUFACTURING A SEMICONDUCTOR ELEMENTAL DEVICE

(75) Inventor: Hirotaka Komatsubara, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 426 days.

(21) Appl. No.: 11/336,952

(22) Filed: Jan. 23, 2006

(65) Prior Publication Data

US 2006/0166412 A1 Jul. 27, 2006

(30) Foreign Application Priority Data

Jan. 24, 2005 (JP) ............................. 2005-015900

(51) Int. Cl.
*H01L 21/76* (2006.01)
(52) U.S. Cl. .................................... 438/449
(58) Field of Classification Search .................. 438/449
See application file for complete search history.

(56) References Cited

U.S. PATENT DOCUMENTS

| 6,511,893 B1 * | 1/2003 | Woodruff et al. ............ 438/449 |
| 7,285,452 B2 * | 10/2007 | Sadaka et al. ............... 438/198 |
| 2003/0068870 A1 | 4/2003 | Komatsubara |
| 2006/0003561 A1 * | 1/2006 | Goktepeli ................... 438/528 |

FOREIGN PATENT DOCUMENTS

JP 2003-124303 4/2001

OTHER PUBLICATIONS

J.W. Thomas et al., "Characteristics of Submicrometer LOCOS Isolation", Proceedings 1995 IEEE International SOI Conference, IEEE, Oct. 1995, p. 116-117.

* cited by examiner

*Primary Examiner*—Thao X Le
*Assistant Examiner*—Kimberly Trice
(74) *Attorney, Agent, or Firm*—Rabin & Berdo, P.C.

(57) ABSTRACT

A method for manufacturing a semiconductor elemental device including an SOI structure in which an SOI layer is laminated, includes the steps of setting transistor forming regions and a device isolation region to the SOI layer, forming a pad oxide film over the SOI layer and forming an oxidation-resistant film over the pad oxide film; forming a resist mask in a region corresponding to each of the transistor forming regions, and etching the oxidation-resistant film and the pad oxide film with the resist mask as a mask to expose the SOI layer of the device isolation region; removing the resist mask and oxidizing the exposed SOI layer by a LOCOS method using the oxidation-resistant film to form a field oxide film; and implanting amorphization ions in an edge portion formed in the SOI layer upon formation of the field oxide film to amorphize the edge portion.

3 Claims, 10 Drawing Sheets

EXPLANATORY VIEW SHOWING PROCESS FOR MANUFACTURING SEMICONDUCTOR ELEMENTAL DEVICE ACCORDING TO THIRD EMBODIMENT

EXPLANATORY VIEW SHOWING PROCESS FOR MANUFACTURING SEMICONDUCTOR ELEMENTAL DEVICE ACCORDING TO FIRST EMBODIMENT

GRAPH SHOWING CURRENT-VOLTAGE CHARACTERISTICS OF nMOS ELEMENT OF FIRST EMBODIMENT

EXPLANATORY VIEW SHOWING PROCESS FOR MANUFACTURING SEMICONDUCTOR ELEMENTAL DEVICE ACCORDING TO SECOND EMBODIMENT

Fig. 6

EXPLANATORY VIEW SHOWING PROCESS FOR MANUFACTURING SEMICONDUCTOR ELEMENTAL DEVICE ACCORDING TO SECOND EMBODIMENT

Fig. 7

GRAPH SHOWING CURRENT-VOLTAGE CHARACTERISTICS OF nMOS ELEMENT OF SECOND EMBODIMENT

Fig. 8

EXPLANATORY VIEW SHOWING PROCESS FOR MANUFACTURING SEMICONDUCTOR ELEMENTAL DEVICE ACCORDING TO THIRD EMBODIMENT

Fig. 9

EXPLANATORY VIEW SHOWING PROCESS FOR MANUFACTURING SEMICONDUCTOR ELEMENTAL DEVICE ACCORDING TO THIRD EMBODIMENT

GRAPH SHOWING RESULT OF MEASUREMENT OF CURRENT-VOLTAGE CHARACTERISTICS OF PROTOTYPED CONVENTIONAL nMOS ELEMENT

METHOD FOR MANUFACTURING A SEMICONDUCTOR ELEMENTAL DEVICE

BACKGROUND OF THE INVENTION

The present invention relates to a method for manufacturing a semiconductor elemental device wherein a device isolation layer is formed in an SOI layer of an SOI (Silicon On Insulator) substrate by a LOCOS (Local Oxidation of Silicon) method.

An SOI substrate is formed by sequentially laminating a support substrate, an insulating layer (so-called BOX oxide film) and a silicon thin film layer (called SOI layer) formed of monocrystalline silicon. Since a field oxide film electrically insulates and separates between elements of a semiconductor elemental device formed in an SOI layer of the SOI substrate to make it possible to suppress an soft error and latchup and reduce a junction capacitance of a source/drain section, such an SOI substrate has been used in the manufacture of a number of semiconductor devices as a technique that can contribute to speeding up and a reduction in power consumption.

A trench structure and a LOCOS method are used to form the field oxide film that separates between the elements. However, the trench structure has a disadvantage that since an SOI layer is etched to define trenches and an oxide film is embedded in the trenches, the number of processes increases and the cost of manufacturing thereof increases as compared with the LOCOS method.

On the other hand, the LOCOS method is advantageous to a reduction in manufacturing cost. It is however known that a thin silicon layer (called an edge portion) having a triangular section is formed at a boundary among an insulating layer, a field oxide film and an SOI layer upon formation of the field oxide film by the LOCOS method and constitutes a parasitic MOSFET (MOS (Metal Oxide Semiconductor) Field Effect Transistor), and this parasitic MOSFET exerts an adverse effect on current characteristics of an N channel MOS element (called an nMOS element) and is brought to a bump characteristic in which a bump occurs in current-voltage characteristics, thereby reducing a threshold voltage.

As the technique of preventing such a reduction in the threshold voltage, a simulation result has been reported that the bump characteristic can be suppressed by raising a boron concentration of the edge portion formed in the SOI layer (refer to, for example, a non-patent document 1 (J. W. Thomas and two more ones, "Characteristics of Submicrometer LOCOS Isolation", Proceedings 1995 IEEE International SOI Conference, IEEE, October 1995, p. 116-117)).

The inventors have actually prototyped an nMOS element using conditions shown in Table 1 of the non-patent document 1 and evaluated its current-voltage characteristics.

Process steps at this time are as follows: A pad oxide film is formed in its corresponding SOI layer of an SOI substrate. A silicon nitride film is deposited on the pad oxide film by a CVD (Chemical Vapor Deposition) method and thereafter patterned by photolithography and etching, thereby removing the pad oxide film and silicon nitride film in a device isolation region and forming a filed oxide film in the exposed SOI layer by a LOCOS method.

After the formation of the field oxide film, boron ions are implanted to raise the boron concentration of each edge portion, and thereafter the pad oxide film and silicon nitride film in the corresponding transistor forming region are removed.

Thereafter, the formation of a gate oxide film, the formation of a gate and the formation of a source/drain section are executed in a manner similar to the normal nMOS element manufacturing process, and the corresponding nMOS element used for evaluation was formed.

Figure 10:
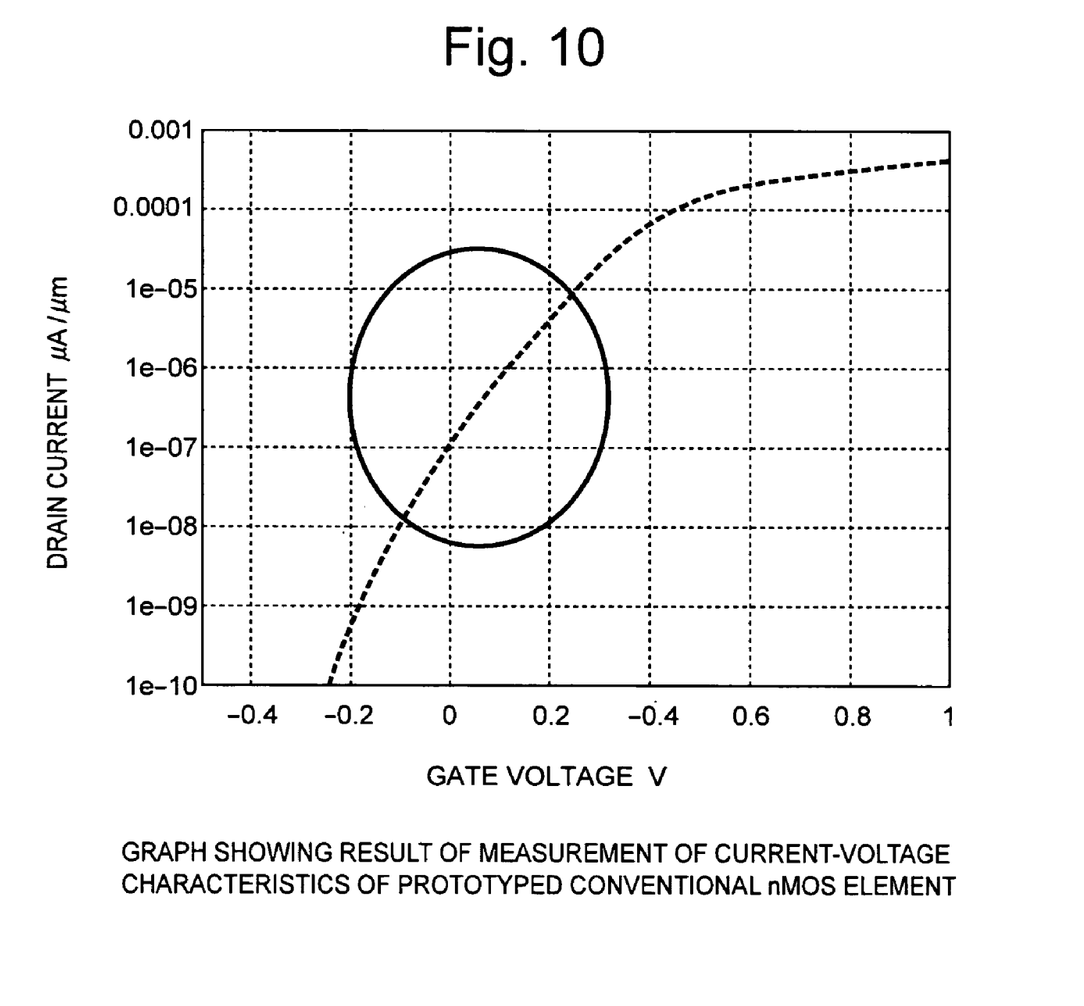
FIG. 10 is a graph showing the result of measurement of current-voltage characteristics of a conventional prototyped nMOS element.

The result of measurement of current-voltage characteristics of the nMOS element prototyped in this way is shown in FIG. 10.

FIG. 10 shows a drain current per unit width, which flows between the source and drain with respect to each gate voltage. It is understood from the current-voltage characteristics of the nMOS element prototyped according to the above that as shown in FIG. 10, a bump occurs in a region enclosed with a circle and there is room for improvement in bump characteristic.

For the purpose of improving such a bump characteristic, the inventors have proposed that after the formation of a field oxide film, P type impurity ions such as boron are implanted in an SOI layer to form a high-concentration impurity region at an edge portion, and on such a heat-treatment condition that the impurity in the high-concentration impurity region is not diffused into a channel section before the removal of a pad oxide film and a silicon nitride film in a transistor forming region, the damage of the field oxide film due to ion implantation at the formation of the high-concentration impurity region is recovered and the amount of cutting of the field oxide film is reduced (refer to, for example, a patent document 1 (Japanese Unexamined Patent Publication No. 2003-124303 (paragraph numbers 0019-0021 in page 4, FIG. 2 and FIG. 3)).

It has been proposed by the specification disclosed in Japanese Patent Application No. 2003-328092 that a metal oxide film such as aluminum oxide is formed in a slope or inclined part of an edge portion or a device isolation region of an SOI layer before a field oxide film is formed in the SOI layer having exposed the device isolation region by a LOCOS method, and the field oxide film is formed on the metal oxide film to thereby reduce a bump characteristic through the use of a negative fixed electrical charge contained in a defect produced due to the reaction of an interface between the SOI layer and the metal oxide film.

However, the technique of the non-patent document 1 referred to above is accompanied by a problem that although the simulation result that the bump characteristic can be suppressed by enhancing the boron concentration of the edge portion formed in the SOI layer is obtained, the above-described bump characteristic appears in an actual nMOS element.

That is, the simulation result that the bump characteristic can be suppressed by enhancing the impurity concentration of boron or the like at the edge portion, is considered to be correct. However, it is considered to be proper because the impurity of the edge portion is diffused due to heat treatment executed in the subsequent process and eventually the impurity concentration of the edge portion is reduced so that the effect of suppressing the bump characteristic is degraded. This becomes a problem particularly important for an increase in the thermal processing process with multifunctioning of the recent semiconductor device.

SUMMARY OF THE INVENTION

The present invention has been made to solve the above problems. It is an object of the present invention to provide a means for stabilizing the concentration of an impurity at an edge portion of an SOI layer.

According to one aspect of the present invention, for attaining the above object, there is provided a method for manufacturing a semiconductor elemental device comprising an SOI structure in which an SOI layer is laminated, comprising the steps of setting transistor forming regions and a device isolation region to the SOI layer, forming a pad oxide film over the SOI layer and forming an oxidation-resistant film over the pad oxide film; forming a resist mask in a region corresponding to each of the transistor forming regions, and etching the oxidation-resistant film and the pad oxide film with the resist mask as a mask to expose the SOI layer of the device isolation region; removing the resist mask and oxidizing the exposed SOI layer by a LOCOS method using the oxidation-resistant film to form a field oxide film; and implanting amorphization ions in an edge portion formed in the SOI layer upon formation of the field oxide film to amorphize the edge portion.

Thus, the present invention can obtain advantageous effects in that a crystal structure of each edge portion can be scaled down by amorphization and brought to complexity, the diffusion of a P type impurity having flowed therein to other portions due to the subsequent heat treatment or the like can be prevented and the impurity concentration of each edge portion of the SOI layer can be stabilized, and in that the solid solubility of each injected P type impurity ion is improved so that the impurity concentration of the edge portion can be made thicker, and a bump characteristic is suppressed thereby making it possible to raise the threshold voltage of a drain current of an nMOS element.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of a method for manufacturing a semiconductor elemental device, according to the present invention will hereinafter be described with reference to the accompanying drawings.

First Preferred Embodiment

Figure 1:
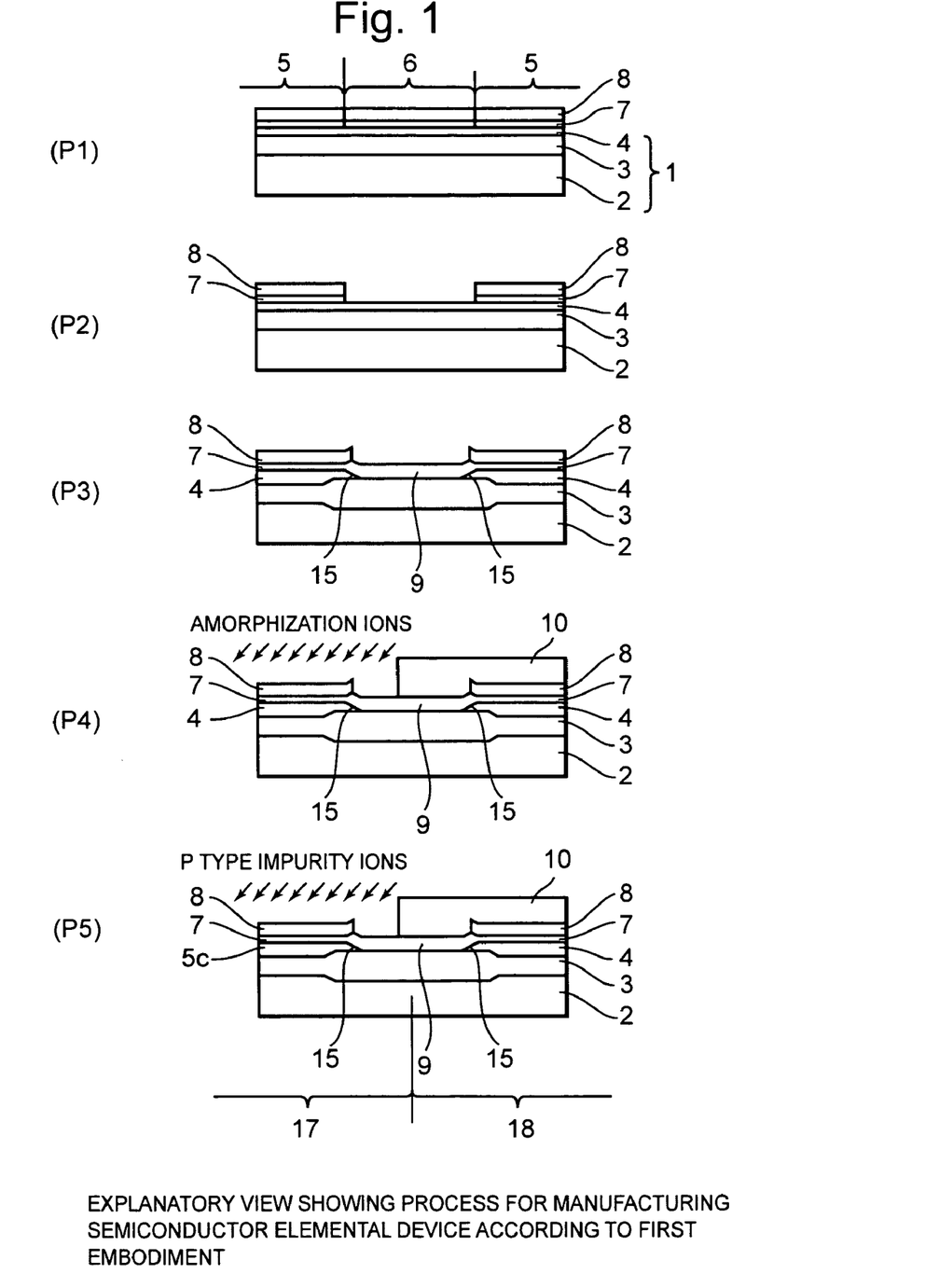
FIG. 1 is an explanatory view showing a process for manufacturing a semiconductor elemental device, according to a first embodiment of the present invention.
Figure 2:
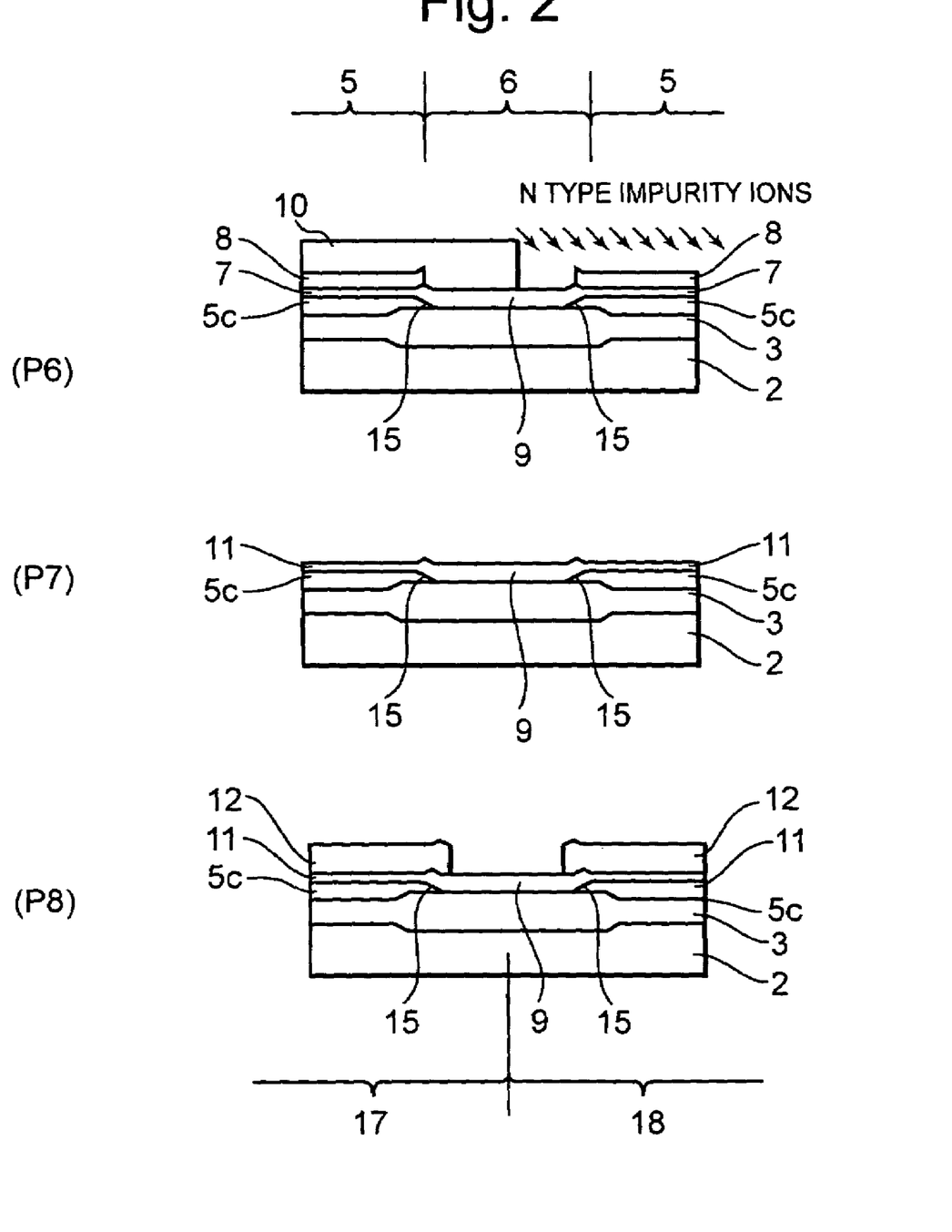
FIG. 2 is an explanatory view illustrating the process for manufacturing the semiconductor elemental device, according to the first embodiment.
Figure 3:
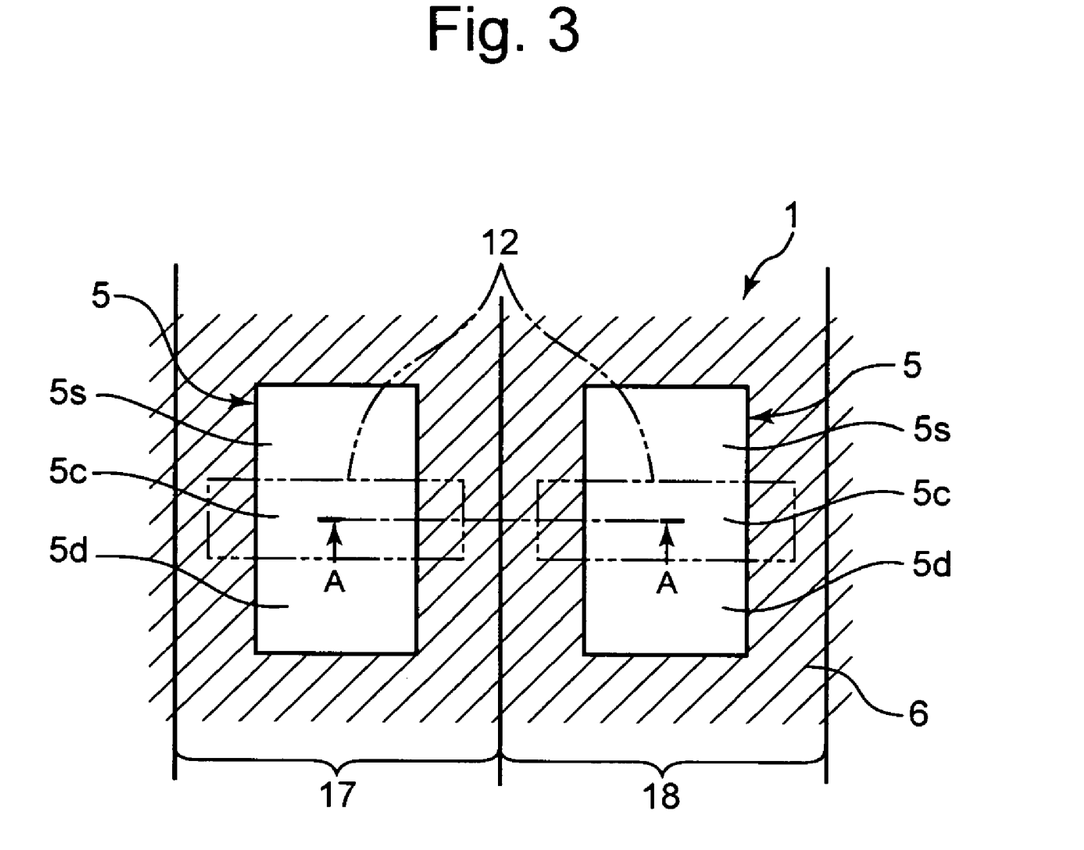
FIG. 3 is an explanatory view as seen from above, showing an SOI substrate employed in the first embodiment.

FIGS. 1 and 2 are explanatory views showing a process for manufacturing a semiconductor elemental device, according to a first embodiment, and FIG. 3 is an explanatory view as seen from above, showing an SOI substrate, respectively.

Incidentally, FIGS. 1 and 2 respectively show sections taken along sectional line A-A shown in FIG. 3.

In FIGS. 1 and 2, reference numeral 1 indicates the SOI substrate, which is formed by laminating a support substrate 2 formed of silicon or the like, an insulating layer 3 corresponding to an embedded insulating film formed of silicon dioxide, which is formed on the support substrate 2, and an SOI layer 4 formed of thin monocrystalline silicon.

As shown in FIG. 3, transistor forming regions 5 and a device isolation region 6 (hatched area shown in FIG. 3) are set to the SOI layer 4 employed in the present embodiment. An nMOS element and a pMOS element (P channel MOS element) corresponding to MOSFETs are formed in the transistor forming regions 5. A field oxide film 9 to be described later is formed in the device isolation region 6.

Reference numeral 7 indicates a pad oxide film, which is a thin silicon dioxide film formed on the SOI layer 4 by a thermal oxidation method or the like.

Reference numeral 8 indicates a silicon nitride film constituted as an oxidation-resistant film. The silicon nitride film is a film formed of silicon nitride, which is deposited on the pad oxide film 7 by a CVD method or the like and functions as a mask used when the field oxide film 9 is formed by a LOCOS method.

The pad oxide film 7 has a function or the like which relaxes stress developed due to the difference between lattice constants of crystal structures of the silicon nitride film 8 and the SOI layer 4 corresponding to the monocrystalline silicon.

The field oxide film 9 is of an insulating film composed of silicon dioxide, which is formed by dry-oxidizing silicon of the SOI layer 4 in the device isolation region 6 using the LOCOS method. The filed oxide film 9 electrically insulates and separates between the transistor forming regions 5 each corresponding to the SOI layer 4.

Reference numeral 10 indicates a resist mask, which is a mask member formed on the silicon nitride film 8 or the like by photolithography or the like. The resist mask has the function of protecting a region masked so as to cover each transistor forming region 5 or the like for the SOI layer 4 upon etching processing or the like from etching.

Reference numeral 11 indicates a gate oxide film, which is an insulating film composed of silicon dioxide or the like formed between channel sections 5c of the SOI layer 4 in the transistor forming regions 5 and gates 12 formed of polysilicon or the like.

Reference numerals 15 indicate edge portions. They are thin silicon layers having triangular sections, each of which is formed at a boundary portion among the insulating layer 3, the field oxide film 9 and the SOI layer 4 by such bird beaks that the tips of the field oxide film 9 branch off and expand into the pad oxide film 7 between the silicon nitride film 8 and the SOI layer 4.

A predetermined impurity is diffused into the SOI layers 4 placed directly below the gates 12 to form channel sections 5c in the transistor forming regions 5 shown in FIG. 3. A predetermined impurity is diffused into the SOI layers 4 placed on both sides of the channel sections 5c respectively to form source sections 5s and drain sections 5d.

Reference numeral 17 indicates an nMOS region of the SOI substrate 1. The nMOS region is a region separated in a lengthwise direction in FIG. 3, and a P type diffusion layer is formed in its corresponding channel section 5c of the transistor forming region 5 thereof, whereas an N type diffusion layer is formed in each of the source section 5s and the drain section 5d, so that the nMOS element is formed.

Reference numeral 18 indicates a pMOS region of the SOI substrate 1. The pMOS region is a region divided in a manner similar to the nMOS region 17, and an N type diffusion layer is formed in its corresponding channel section 5c of the transistor forming region 5 thereof, whereas a P type diffusion layer is formed in each of the source section 5s and the drain section 5d, whereby the pMOS element is formed.

Incidentally, although FIG. 3 is plotted in such a manner that the nMOS region 17 and the pMOS region 18 adjoin each other for convenience of explanation, they may alternately be disposed adjacent to one another. Alternatively, a plurality of the nMOS regions 17 or a plurality of the pMOS regions 18 may be collectively disposed. In short, they may suitably be set depending upon convenience of the manufacturing process.

A method for manufacturing the semiconductor elemental device, according to the present embodiment will hereinafter be explained in accordance with processes indicated by P by using FIGS. 1 and 2.

In P1 (see FIG. 1), an SOI substrate 1 having a pre-fabricated support substrate 2, an insulating layer 3 and such an SOI layer 4 that transistor forming regions 5 and a device isolation region 6 are set onto its surface, is prepared. A pad oxide film 7 is formed on the SOI layer 4 by the thermal oxidation method, and a silicon nitride film 8 is formed on the pad oxide film 7 by the CVD method.

In P2 (see FIG. 1), a resist mask 10, which covers the corresponding transistor forming region 5 of the SOI layer 4 from above, is formed on the silicon nitride film 8 by photolithography. With it as a mask, the silicon nitride film 8 and the pad oxide film 7 are anisotropically etched to expose the SOI layer 4. Thereafter, the resist mask 10 is removed using a remover such as acetone or the like.

In P3 (see FIG. 1), the exposed SOI layer 4 (silicon) is dry-oxidized by the LOCOS method with the remaining silicon nitride film 8 as a mask to form a field oxide film 9 in the device isolation region 6. At this time, bird beaks occur, so that each of edge portions 15 is formed at a boundary portion among the insulating layer 3, the field oxide film 9 and the SOI layer 4.

In P4 (see FIG. 1), a resist mask 10, which covers a region excluding a region in which a channel section 5c of the transistor forming region 5 in the nMOS region 17 is formed, is formed by photolithography. With it as a mask, germanium ions used as amorphization ions ate obliquely implanted toward the edge portion 15 to amorphize the edge portion 15 of the SOI layer 4. The ions are implanted even in the edge portion 15 on the opposite side of the SOI layer 4 in the nMOS region 17 in like manner to amorphize the edge portion 15.

The implantation of the germanium ions in this case may be performed in the ranges of a dose of $10^{13}$ to $10^{15}$ atoms/cm² and an acceleration energy of about 70 to 100 KeV. The angle at which their implantation is made may be 45° or so. In the present embodiment, the dose is $5 \times 10^{13}$ atoms/cm², the acceleration energy is 80 keV and the implantation angle is 45°.

In P5 (see FIG. 1), P type impurity ions, e.g., boron ions for forming the corresponding channel section 5c of an nMOS element are implanted in the transistor forming region 5 of the nMOS region 17 with the resist mask 10 in the process P4 as a mask. Thus, a P type diffusion layer is formed in the SOI layer 4 of the transistor forming region 5 in the nMOS region 17. Its portion functions as the channel section 5c of the nMOS element.

In P6 (see FIG. 2), the resist mask 10 formed in the process P4 is removed using a remover. A resist mask 10, which covers the region excluding the region in which the channel section 5c of the transistor forming region 5 in the pMOS region 18 is formed, is formed again by photolithography. With it as a mask, N type impurity ions, e.g., phosphorus ions for forming the corresponding channel section 5c of a pMOS element are implanted. Thus, an N type diffusion layer is formed in the SOI layer 4 of the transistor forming region 5 in the pMOS region 18. It functions as the channel section 5c of the pMOS element.

In P7 (see FIG. 2), the resist mask 10 formed in the process P6 is removed using a remover, and the silicon nitride film 8 and the pad oxide film 7 are removed by wet etching using thermal or hot phosphoric acid and hydrofluoric acid. In this case, the pad oxide film 7 functions even as a protective film at the removal of the silicon nitride film 8 by the hot phosphoric acid.

Then, a resist mask 10, which covers a region excluding the channel sections 5c in the nMOS region 17 and the pMOS region 18, is formed by photolithography. With it as a mask, a gate oxide film 11 is formed on each of the channel sections 5c.

In P8 (see FIG. 2), the resist mask 10 formed in the process P7 is removed using a remover, and a polysilicon layer is formed on the gate oxide film 11 or the like. A resist mask 10, which covers the regions in which the gates 12 in the nMOS region 17 and the pMOS region 18 are formed, is formed by photolithography. With it as a mask, the polysilicon layer is etched to form each gate 12.

Then, source sections 5s and drain sections 5d with predetermined ions diffused therein, of respective MOSFETs are formed on both sides of the channel sections 5c of the respective transistor forming regions 5 in a manner similar to the normal process of MOSFETs.

The semiconductor elemental device according to the present embodiment, which is surrounded by the field oxide film 9, is formed in the corresponding transistor forming region 5 of the SOI layer 4 of the SOI substrate 1 in the above-described manner.

In the thus-formed nMOS element, the edge portions 15 are amorphized by implantation of the germanium ions in the process P4, and the crystal structures of the edge portions 15 are miniaturized or scaled down, so that their structures increase in complexity. Hence the diffusion of boron having flowed therein to other portions such as the channel sections 5c due to the subsequent thermal treatment or the like can be prevented. Further, the solid solubility of each implanted boron ion is enhanced to thereby raise an activation rate, whereby each edge portion becomes thick in boron concentration. It is therefore possible to increase the resistance of the edge portion 15, and prevent leakage of a drain current to thereby raise the threshold voltage of the nMOS element.

Figure 4:
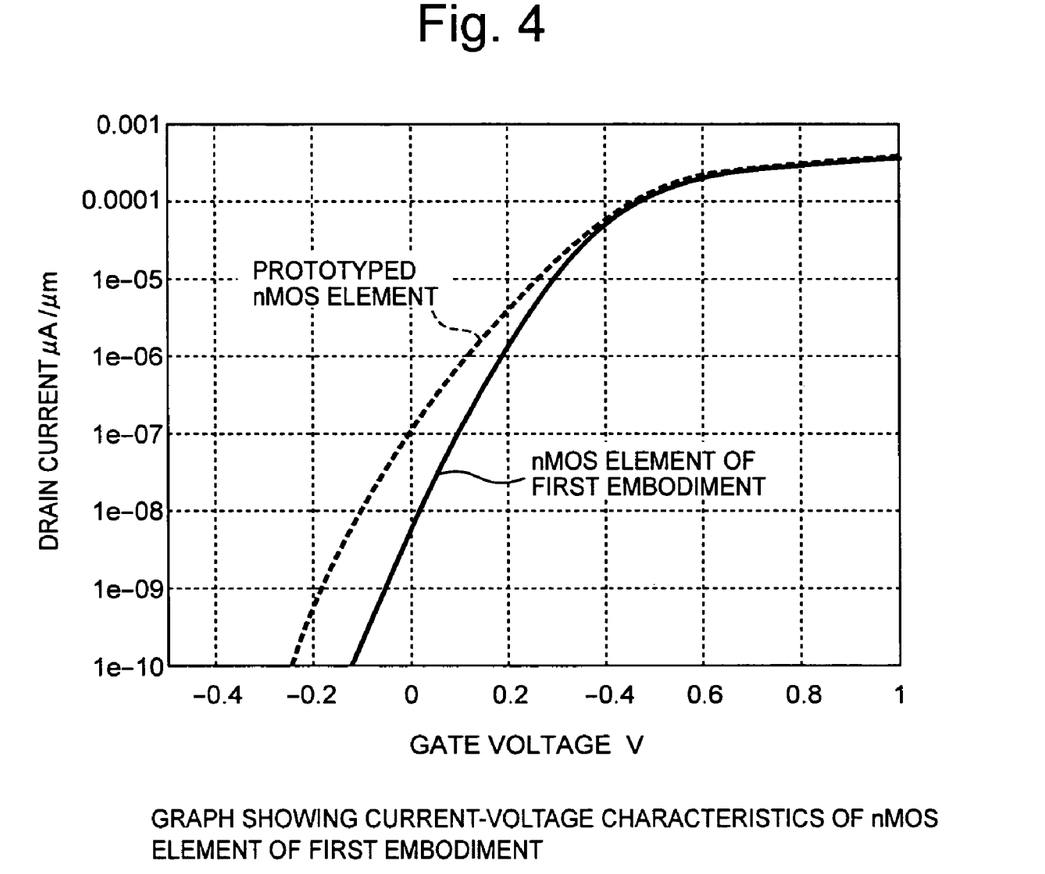
FIG. 4 is a graph showing current-voltage characteristics of an nMOS element according to the first embodiment.

FIG. 4 is a graph showing current-voltage characteristics of the nMOS element according to the first embodiment.

Current-voltage characteristics predicted by simulation of the nMOS element of the present embodiment indicated by a solid line in FIG. 4 become higher in threshold voltage than current-voltage characteristics (identical to FIG. 10) of the prototyped nMOS element indicated by the broken line for comparison, and a bump characteristic is suppressed, whereby the leak characteristic of the nMOS element is improved.

Incidentally, although the present embodiment has explained the case in which the amorphization ions injected for amorphizing the edge portions 15 are the germanium ions, the amorphization ions are not limited to above but may be argon ions or the like.

Although a description has been made of the process P4 wherein the resist mask 10 is formed in the region excluding the region in which the channel section 5c of the nMOS region 17 is formed, the resist mask 10 is formed in the region excepting the transistor forming region 5 of the nMOS region 17 and all of the edge portions 15 of the SOI layer 4 may be amorphized. Even though done in this way, no bump characteristic occurs in the current-voltage characteristics of the nMOS element.

In the present embodiment as described above, the germanium ions are implanted in each edge portion formed in the SOI layer upon formation of the field oxide film to amorphize the edge portion. Consequentially, the crystal structure of each edge portion can be scaled down and complicated. Further, the diffusion of boron having flowed therein to other portions due to the subsequent heat treatment or the like can be prevented and the impurity concentration of each edge portion of the SOI layer can be stabilized. Besides, the solid solubility of each injected boron ion is improved so that the boron concentration of the edge portion can be made thicker. The bump characteristic is suppressed, thereby making it possible to raise the threshold voltage of the drain current of the nMOS element.

Second Preferred Embodiment

Figure 5:
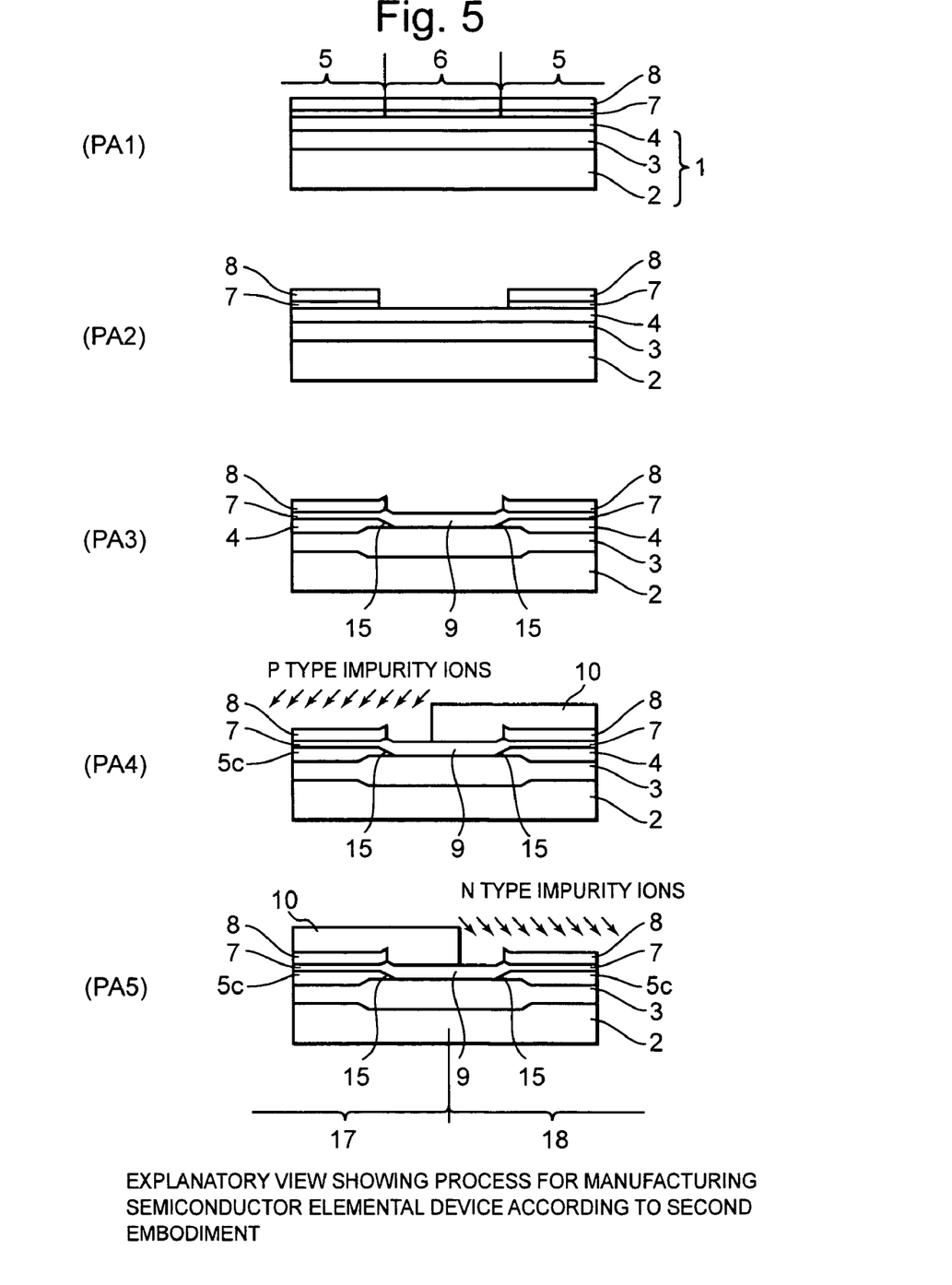
FIG. 5 is an explanatory view illustrating a process for manufacturing a semiconductor elemental device, according to a second embodiment of the present invention.
Figure 6:
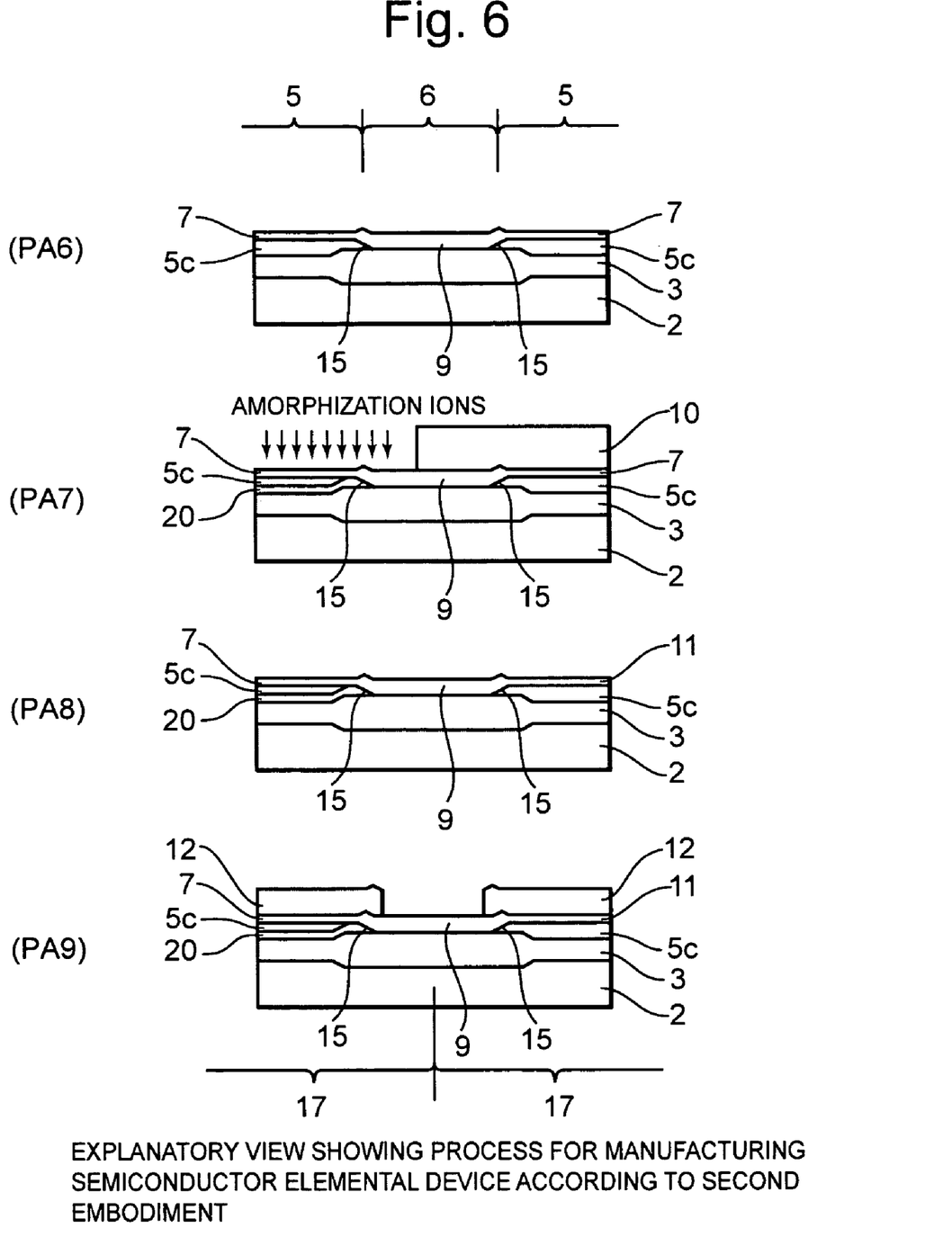
FIG. 6 is an explanatory view showing the process for manufacturing the semiconductor elemental device, according to the second embodiment.

FIGS. 5 and 6 are explanatory views showing a process for manufacturing a semiconductor elemental device, according to a second embodiment.

Incidentally, constituent portions similar to those employed in the first embodiment are given the same reference numerals, and their explanations will be omitted.

A method for manufacturing the semiconductor elemental device, according to the present embodiment will hereinafter be described in accordance with processes indicated by PA using FIGS. 5 and 6.

Since processes PA1 through PA3 (see FIG. 5) are similar to the processes P1 through P3 of the first embodiment, the description thereof will be omitted.

In PA4 (see FIG. 5), a resist mask 10, which covers a region excluding a region in which a channel section 5c of a transistor forming region 5 in an nMOS region 17 is formed, is formed by photolithography. With the resist mask 10 as a mask, P type impurity ions, e.g., boron ions are implanted in a manner similar to the process P5 of the first embodiment to form a P type diffusion layer which functions as a channel section 5c of an nMOS element, in an SOI layer 4 of the transistor forming region 5 in the nMOS region 17.

In PA5 (see FIG. 5), N type impurity ions, e.g., phosphorus ions are implanted in a manner similar to the process P6 of the first embodiment to form an N type diffusion layer which functions as a channel section 5c of a pMOS element, in the SOI layer 4 of a transistor forming region 5 in a pMOS region 18.

In PA6 (see FIG. 6), a resist mask 10 formed in the process PA5 is removed using a remover, and a silicon nitride film 8 is removed by wet etching using hot or thermal phosphoric acid to expose a region corresponding to the transistor forming region 5, of a pad oxide film 7. In this case, the pad oxide film 7 functions even as a protective film at the removal of the silicon nitride film 8 by the hot phosphoric acid.

In PA7 (see FIG. 6), a resist mask 10, which covers the region excluding the nMOS region 17, is formed by photolithography. With it as a mask, germanium ions are implanted from above in the SOI layer 4 containing an edge portion 15 formed in the SOI layer 4 of the transistor forming region 5 in the nMOS region 17, and thereafter heat treatment is executed. Thus, an SiGe layer formed by substituting part of silicon with germanium is generated in a layer (called a bottom layer 20 of the SOI layer 4) near a boundary face between the SOI layer 4 and an insulating layer 3. Hence the edge portions 15 placed on both sides of the SOI layer 4 are amorphized.

A dose and acceleration energy at the implantation of the germanium ions in this case are similar to the process P4 of the first embodiment.

In PA8 (see FIG. 6), the pad oxide film 7 is removed by wet etching using hydrofluoric acid. A resist mask 10, which covers the region excluding the channel sections 5c of the nMOS region and the pMOS region, is formed by photolithography. With it as a mask, a gate oxide film 11 is formed on each of the channel sections 5c.

In PA9 (see FIG. 6), a polysilicon layer is formed in a manner similar to the process P8 of the first embodiment and etched to form respective gates 12.

Then, source sections 5s and drain sections 5d with a predetermined impurity diffused therein, of respective MOSFETs are formed on both sides of the channel sections 5c of the respective transistor forming regions 5 in a manner similar to the normal process of MOSFETs.

The semiconductor elemental device according to the present embodiment, which is surrounded by the field oxide film 9, is formed in the corresponding transistor forming region 5 of the SOI layer 4 of the SOI substrate 1 in the above-described manner.

In the thus-formed nMOS element, the edge portion 15 is amorphized by implantation of the germanium ions in the process PA7 and acts in a manner similar to the first embodiment. Besides, the SiGe layer is generated in the bottom layer 20 of the SOI layer 4. The SiGe layer generates a tensile force at the corresponding channel section 5c of the nMOS element, and a driving force of the channel section 5c is enhanced owing to its distortion, thereby increasing a rated drain current of the nMOS element.

Figure 7:
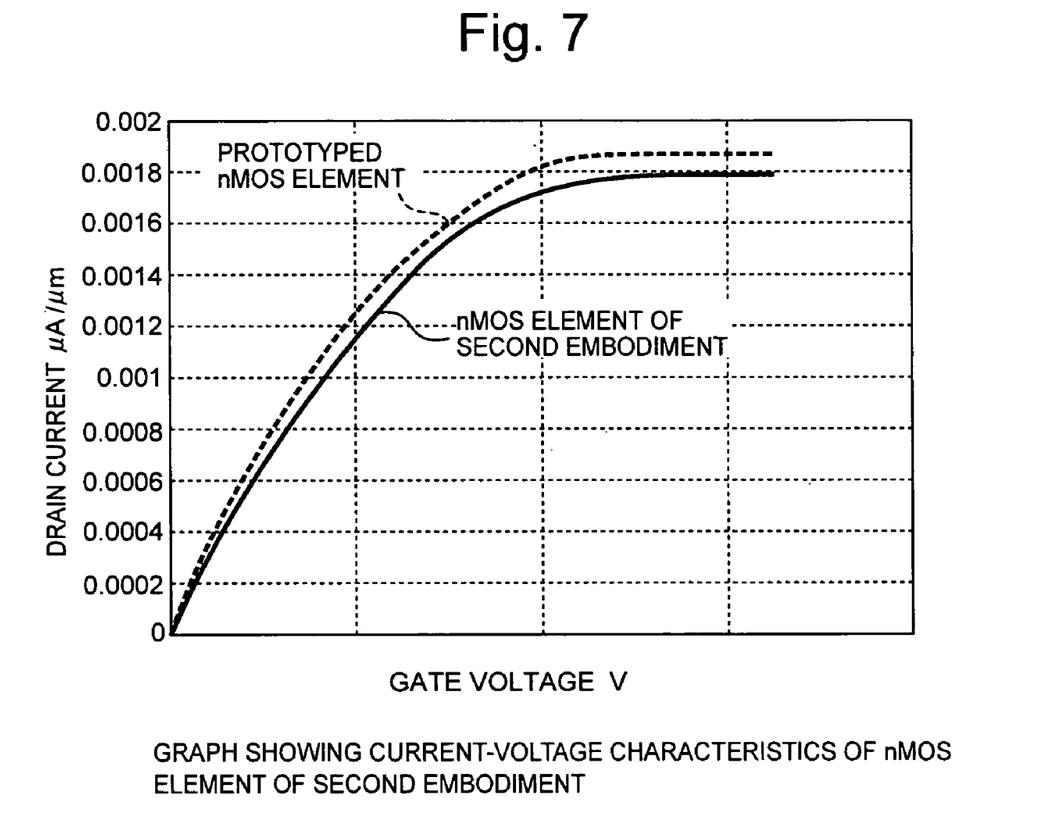
FIG. 7 is a graph illustrating current-voltage characteristics of an nMOS element according to the second embodiment.

FIG. 7 is a graph showing current-voltage characteristics of the nMOS element according to the first embodiment.

Current-voltage characteristics predicted by simulation of the nMOS element of the present embodiment indicated by a solid line in FIG. 4 show that drain currents relative to respective gate voltages increase and a rated drain current of the nMOS element increases as compared with current-voltage characteristics of a prototyped nMOS element indicated by a broken line for comparison.

In the present embodiment as described above, the germanium ions are implanted even in the SOI layer of the nMOS element to generate the SiGe layer in the bottom layer of the SOI layer in addition to an advantageous effect similar to the first embodiment. Consequently, the tensile stress can be generated at the channel section of the nMOS element and the driving force of the channel section is enhanced by the distortion based on the tensile force, thereby making it possible to increase the rated drain current of the nMOS element.

Third Preferred Embodiment

Figure 8:
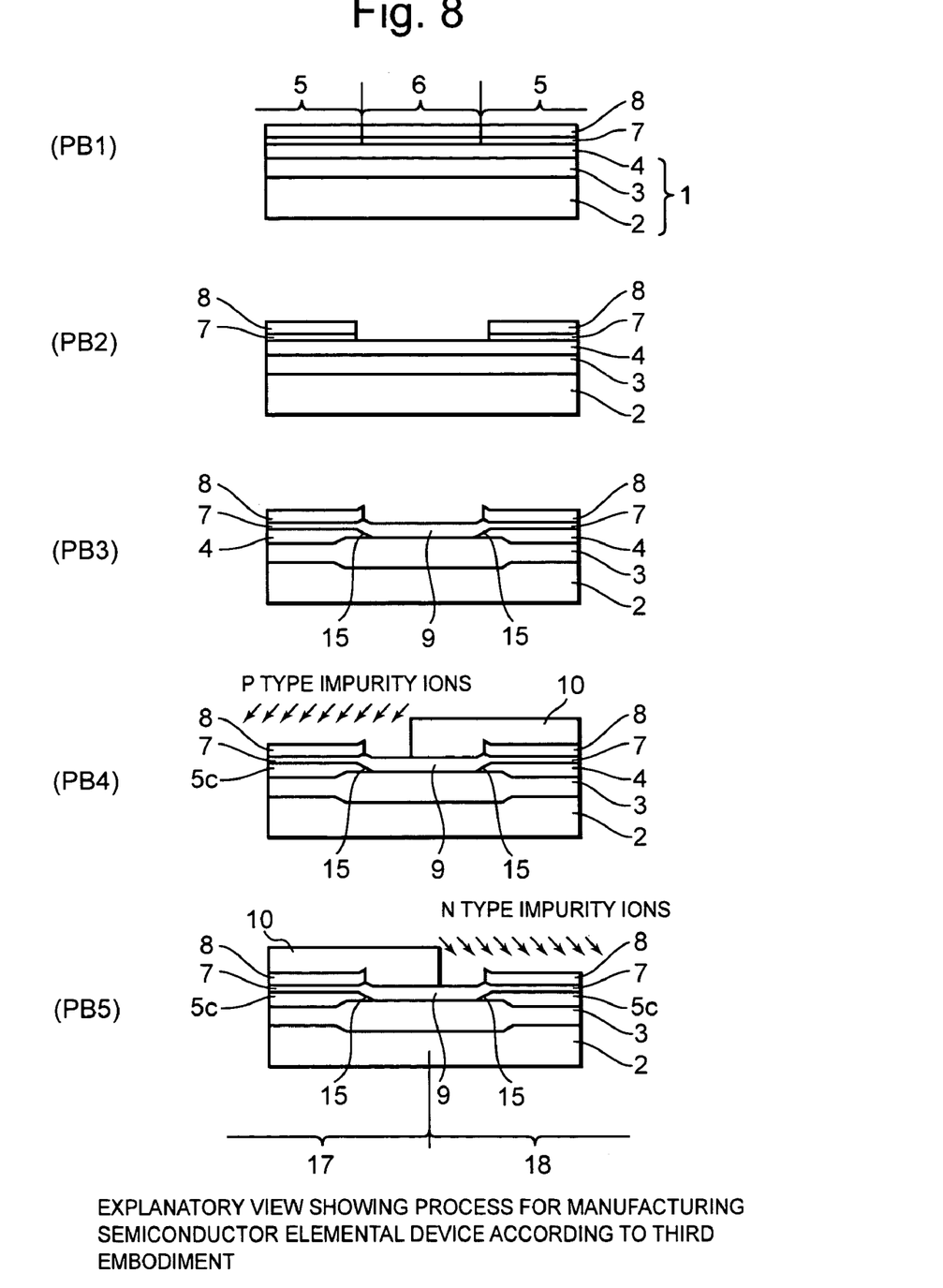
FIG. 8 is an explanatory view showing a process for manufacturing a semiconductor elemental device, according to a third embodiment of the present invention.
Figure 9:
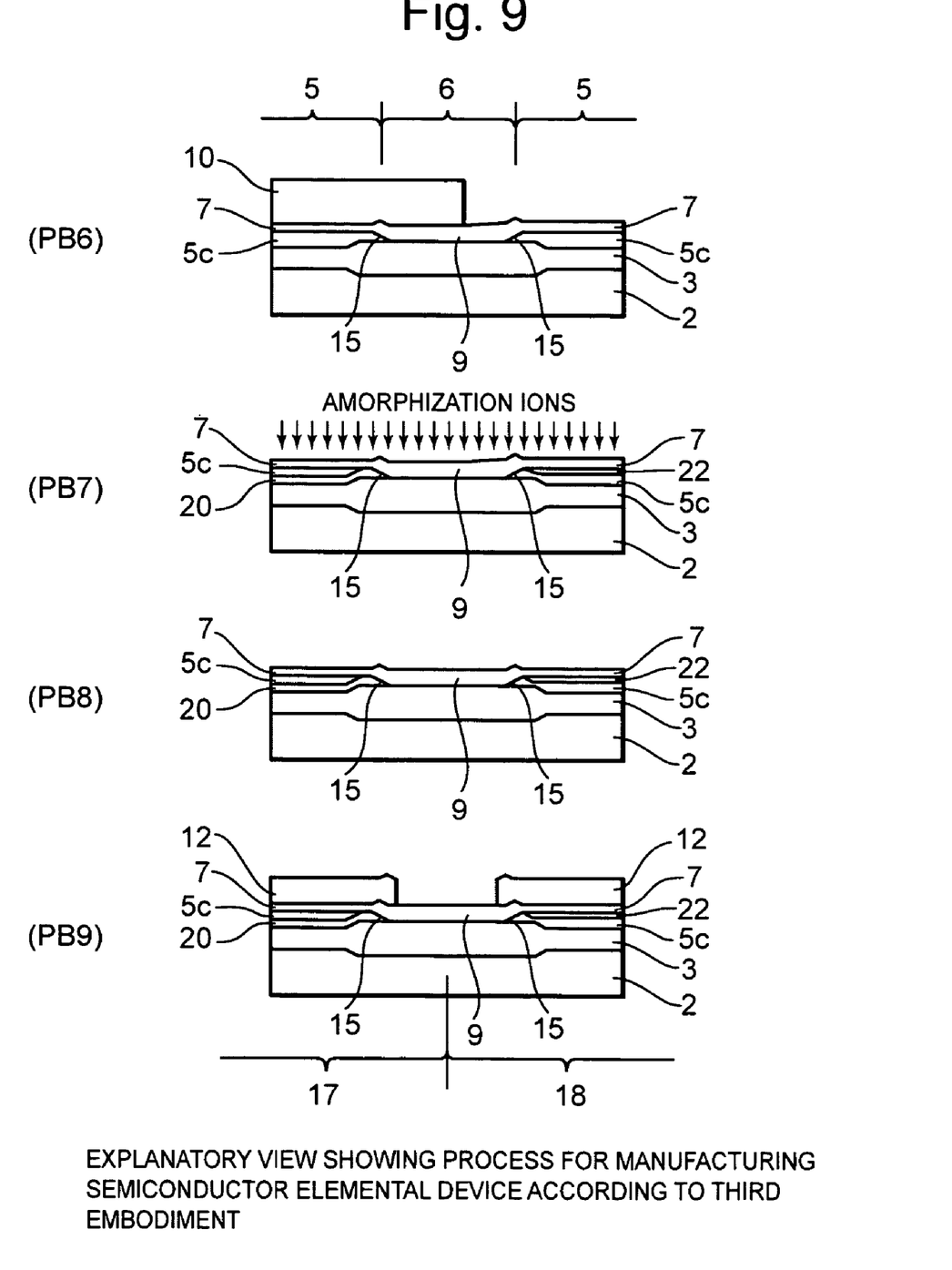
FIG. 9 is an explanatory view illustrating the process for manufacturing the semiconductor elemental device, according to the third embodiment.

FIGS. 8 and 9 are explanatory views showing a process for manufacturing a semiconductor elemental device, according to a third embodiment.

Incidentally, constituent portions similar to those employed in the first and second embodiments are given the same reference numerals, and their explanations will be omitted.

A method for manufacturing the semiconductor elemental device, according to the present embodiment will hereinafter be described in accordance with processes indicated by PA using FIGS. 8 and 9.

Since processes PB1 through PB5 (see FIG. 8) are similar to the processes PA1 through PA5 of the second embodiment, the description thereof will be omitted.

In PB6 (see FIG. 9), a pad oxide film 7 is exposed in a manner similar to the process PA6 of the second embodiment, and a resist mask 10, which covers a region excluding a pMOS region 18, is formed by photolithography. An oxide (silicon dioxide in the present embodiment) is deposited on the pad oxide film 7 of the pMOS region 18 by a CVD method to grow the pad oxide film 7 of the pMOS region 18, whereby its thickness is thickened to about ⅔ of the thickness of an SOI layer 4.

In PB7 (see FIG. 9), the resist mask 10 formed in the process PB6 is removed using a remover. Germanium ions are implanted from above in the SOI layer 4 in each of an nMOS region 17 and the pMOS region 18 containing an edge portion 15 formed in the SOI layer 4 of the transistor forming region 5 in the nMOS region 17, and thereafter heat treatment is executed. Thus, an SiGe layer is generated in a bottom layer 20 of the SOI layer 4 in the nMOS region 17, which is covered with the thin pad oxide film 7. At the SOI layer 4 of the pMOS region 18, which is covered with the thick pad oxide film 7, an SiGe layer is generated in a layer (called a surface layer 22 of the SOI layer 4) near a boundary face between the SOI layer 4 and the thick pad oxide film 7. Hence the edge portions 15 placed on both sides of the SOI layer 4 in the nMOS region 17 are amorphized.

Incidentally, even though the edge portions 15 on both sides of the SOI layer 4 in the pMOS region 18 are amorphized or unamorphized, no influence is exerted on current-voltage characteristics of the pMOS element.

A dose and acceleration energy at the implantation of the germanium ions in this case are similar to the process P4 of the first embodiment.

In PB8 (see FIG. 9), the pad oxide film 7 is removed in a manner similar to the process PA8 of the second embodiment, and a gate oxide film 11 is formed on each channel sections 5c.

Since PB9 (see FIG. 9) is similar to the process PA9 of the second embodiment, the description thereof will be omitted.

Then, source sections 5s and drain sections 5d with a predetermined impurity diffused therein, of respective MOSFETs are formed on both sides of the channel sections 5c of the respective transistor forming regions 5 in a manner similar to the normal process of MOSFETs.

The semiconductor elemental device according to the present embodiment, which is surrounded by the field oxide film 9, is formed in the corresponding transistor forming region 5 of the SOI layer 4 of the SOI substrate 1 in the above-described manner.

In the thus-formed nMOS element, the edge portion 15 of the SOI layer 4 of the nMOS element is amorphized by implantation of the germanium ions in the process PB7 and acts in a manner similar to the first embodiment. Besides, the SiGe layer generated in the bottom layer 20 of the SOI layer 4 in the nMOS region 17 acts in a manner similar to the second embodiment.

The SiGe layer generated in the surface layer 22 of the SOI layer 4 in the pMOS region 18 generates compressive stress at the corresponding channel section 5c of the pMOS element, and a driving force of the channel section 5c is enhanced owing to its distortion, thereby increasing a rated drain current of the pMOS element.

In the present embodiment as described above, the pad oxide film on the SOI layer of the pMOS element is made thick upon implantation of the germanium ions and the SiGe layer is generated in the surface layer of the SOI layer thereof in addition to an advantageous effect similar to the second embodiment. Thus, the compressive stress can be generated at the corresponding channel section of the pMOS element. Further, the driving force of the channel section is enhanced owing to the distortion based on the compressive stress to thereby make it possible to increase the rated drain current of the pMOS element.

Incidentally, although each of the embodiments referred to above has explained the case in which the nMOS and pMOS regions are arranged in row form, the regions for forming one nMOS element and one pMOS element are respectively configured as quadrangular nMOS and pMOS regions, and they may be disposed in zigzags.

While the preferred forms of the present invention have been described, it is to be understood that modifications will be apparent to those skilled in the art without departing from the spirit of the invention. The scope of the invention is to be determined solely by the following claims.

What is claimed is:

1. A method for manufacturing a semiconductor elemental device including an SOI structure in which an SOI layer is laminated, the method comprising the steps of:

setting transistor forming regions and a device isolation region to the SOI layer, forming a pad oxide film over the SOI layer and forming an oxidation-resistant film over the pad oxide film;

forming a resist mask in a region corresponding to each of the transistor forming regions, and etching the oxidation-resistant film and the pad oxide film with the resist mask as a mask to expose the SOI layer of the device isolation region;

removing the resist mask and oxidizing the exposed SOT layer by a LOCOS method using the oxidation-resistant film to form a field oxide film;

removing the oxidation-resistant film to expose the pad oxide film;

forming another resist mask in a region excluding a pMOS region for forming a pMOS element;

depositing an oxide over the pad oxide film of the pMOS region with the another resist mask as a mask to grow the pad oxide film; and removing the another resist mask and implanting germanium ions in the SOI layer in each of both an nMOS region containing an edge portion formed in the SOI layer in the nMOS region and the pMOS region upon formation of the field oxide film to thereby amorphize the edge portion.

2. The method according to claim 1, wherein the germanium ions are implanted in a bottom layer of the SOI layer in the nMOS region to generate an SiGe layer and implanted in a surface layer of the SOI layer in the pMOS region to generate an SiGe layer.

3. The method according to claim 2, wherein a dose of the germanium ions is greater than or equal to $10^{13}$ atoms/cm$^2$.

* * * * *